United States Patent
Lee et al.

(10) Patent No.: US 7,067,389 B2
(45) Date of Patent: Jun. 27, 2006

(54) METHOD FOR MANUFACTURING SEMICONDUCTOR DEVICE

(75) Inventors: Seung Cheol Lee, Icheon-Shi (KR); Sang Wook Park, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 111 days.

(21) Appl. No.: 10/887,258

(22) Filed: Jul. 8, 2004

(65) Prior Publication Data

US 2005/0153520 A1  Jul. 14, 2005

(30) Foreign Application Priority Data

Jan. 9, 2004  (KR) ............... 10-2004-0001656

(51) Int. Cl.
*H01L 21/76* (2006.01)

(52) U.S. Cl. .............. 438/424; 438/253; 438/264; 438/275; 438/751; 257/500

(58) Field of Classification Search ........... 438/424, 438/257
See application file for complete search history.

(56) References Cited

U.S. PATENT DOCUMENTS 6,465,306 B1 * 10/2002 Ramsbey et al. ........... 438/279
6,642,105 B1 * 11/2003 Kim et al. .................. 438/257

* cited by examiner

Primary Examiner—Carl Whitehead, Jr.
Assistant Examiner—Colleen E. Rodgers
(74) Attorney, Agent, or Firm—Marshall, Gerstein & Borun LLP

(57) ABSTRACT

The present invention discloses a method for forming an element isolation film of a semiconductor device, comprising the steps of: sequentially forming a pad oxide film, a pad nitride film and a mask oxide film on a semiconductor substrate on which a first region for forming a high voltage device and a second region for forming a low voltage device or a flash memory cell are defined; etching the mask oxide film, the pad nitride film and the pad oxide film in the first region and the mask oxide film in the second region, and forming an oxide film for the high voltage device in the first region; removing the residual pad nitride film in the second region; removing the nitride film and partially removing the oxide film for the high voltage device in the first region, wherein the oxide film for the high voltage device has a third thickness; removing the residual pad oxide film in the second region; partially removing the oxide film for the high voltage device in the first region according to a cleaning process, wherein the oxide film for the high voltage device has a third thickness; and forming a tunnel oxide film over the resulting structure, wherein a gate oxide film for a high voltage device including the oxide film for the high voltage device and the tunnel oxide film is formed in the first region, and the tunnel oxide film for the low voltage device and cell is formed in the second region.

7 Claims, 5 Drawing Sheets

METHOD FOR MANUFACTURING SEMICONDUCTOR DEVICE

BACKGROUND

1. Field of the Invention

The present invention relates to a method for manufacturing a semiconductor device, and more particularly to, a method for forming a gate oxide film for a high voltage device, and a gate oxide film for a cell and low voltage device in a NAND flash device.

2. Discussion of Related Art

In general, a flash memory device is defined as a high voltage device region where a high voltage device is formed, and a cell region where a cell and a low voltage device are formed. Gate oxide films of transistors formed in the high voltage device region and the cell region are different in thickness according to characteristics of each region. That is, a thickness of a tunnel oxide film formed in the cell region is smaller than that of a gate oxide film formed in the high voltage device region.

FIGS. 1A to 1C are sectional SEM photographs showing a conventional semiconductor substrate where a tunnel oxide film and a gate oxide film have been formed.

Referring to FIGS. 1A to 1C, an element isolation process is performed on the semiconductor substrate where the gate oxide film for the high voltage device has been formed in a high voltage device region and the tunnel oxide film has been formed in a cell and low voltage device region, to form an element isolation film. Here, the element isolation film is protruded from the cell and low voltage device region due to a step difference between the gate oxide film for the high voltage device and the tunnel oxide film. That is, an effective fox height (EFH) of the gate oxide film for the high voltage device is 0, but the EFH of the cell and low voltage device region (protrusion of the element isolation film) is approximately 233 Å.

The high voltage device region is damaged during the succeeding process due to the EFH difference. Generally, the gate oxide film for the high voltage device is formed, a cleaning process is performed thereon, and the tunnel oxide film is formed. Here, the semiconductor substrate is damaged due to an excessive cleaning process, and thus characteristics of the tunnel oxide film are deteriorated.

FIG. 2 is a graph showing constant current stress test (CCST) characteristic results of the tunnel oxide film in the conventional process.

As shown in FIG. 2, the CCST characteristic measurement damages the oxide film and tests a collapse time point of the oxide film. The longer the time from damage to collapse is, the more excellent characteristics the oxide film has. In addition, when variations of the collapse time from the top to bottom are constant, the oxide film is uniformly formed. The CCST characteristics of the tunnel oxide film in the conventional process notify uniformity of the whole oxide film and generation of initial defects.

SUMMARY OF THE INVENTION

The present invention is directed to a method for manufacturing a semiconductor device which can optimize a cleaning process, improve characteristics of a tunnel oxide film by using a high voltage device region recess scheme, and reduce an EFH difference between a high voltage device region and a cell and low voltage device region in a process for forming a gate oxide film for a high voltage device and a tunnel oxide film for a cell and low voltage device.

One aspect of the present invention is to provide a method for forming an element isolation film of a semiconductor device, comprising the steps of: sequentially forming a pad oxide film, a pad nitride film and a mask oxide film on a semiconductor substrate on which a first region for forming a high voltage device and a second region for forming a low voltage device or a flash memory cell are defined; etching the mask oxide film, the pad nitride film and the pad oxide film in the first region and the mask oxide film in the second region, and forming an oxide film for the high voltage device in the first region, wherein the oxide film for the high voltage device has a first thickness; removing the residual pad nitride film in the second region, wherein the oxide film for the high voltage device has a second thickness; removing the residual pad oxide film in the second region and partially removing the oxide film for the high voltage device in the first region according to a cleaning process, wherein the oxide film for the high voltage device has a third thickness; and forming a tunnel oxide film over the resulting structure, wherein a gate oxide film for a high voltage device including the oxide film for the high voltage device and the tunnel oxide film is formed in the first region, and the tunnel oxide film for the low voltage device and cell is formed in the second region.

Preferably, the cleaning process is performed for 30 to 100 seconds by using HF aqueous solution diluted by $H_2O$ at a ratio of 50:1 to 300:1.

Preferably, the cleaning process is performed for 40 to 60 seconds by using HF aqueous solution diluted at a ratio of 50:1 to remove the oxide film having a thickness of 30 to 70 Å.

Preferably, the nitride film strip process is performed for 500 to 1200 seconds by using buffered oxide etchant, and for 5 to 10 minutes by using $H_3PO_4$.

Preferably, the oxide film for the high voltage device has a thickness of 350 to 700 Å, a thickness of 300 to 400 Å after the nitride film strip process, and a thickness of 250 to 350 Å after the cleaning process.

Preferably, the step for etching the mask oxide film, the pad nitride film and the pad oxide film in the first region and the mask oxide film in the second region, and forming the oxide film for the high voltage device in the first region includes the steps of: forming a photoresist film pattern for opening the first region on the mask oxide film; etching the mask oxide film in the first region and the photoresist film pattern; etching the pad nitride film in the first region by using the mask oxide film in the second region as an etch mask; etching the pad oxide film in the first region and the mask oxide film in the second region; and forming the oxide film for the high voltage device in the first region according to an oxidation process.

DETAILED DESCRIPTION OF PREFERRED EMBODIMENTS

Figure 1A:
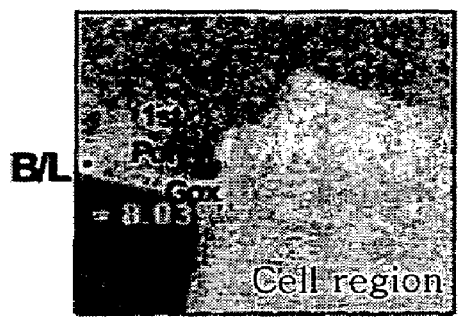
FIGS. 1A to 1C are sectional SEM photographs showing a conventional semiconductor substrate on which a tunnel oxide film and a gate oxide film have been formed.
Figure 1B:
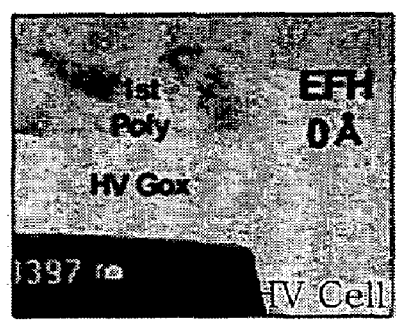
Figure 1C:
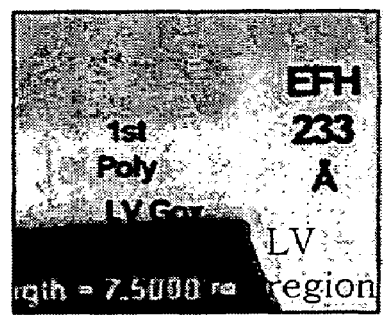
Figure 2:
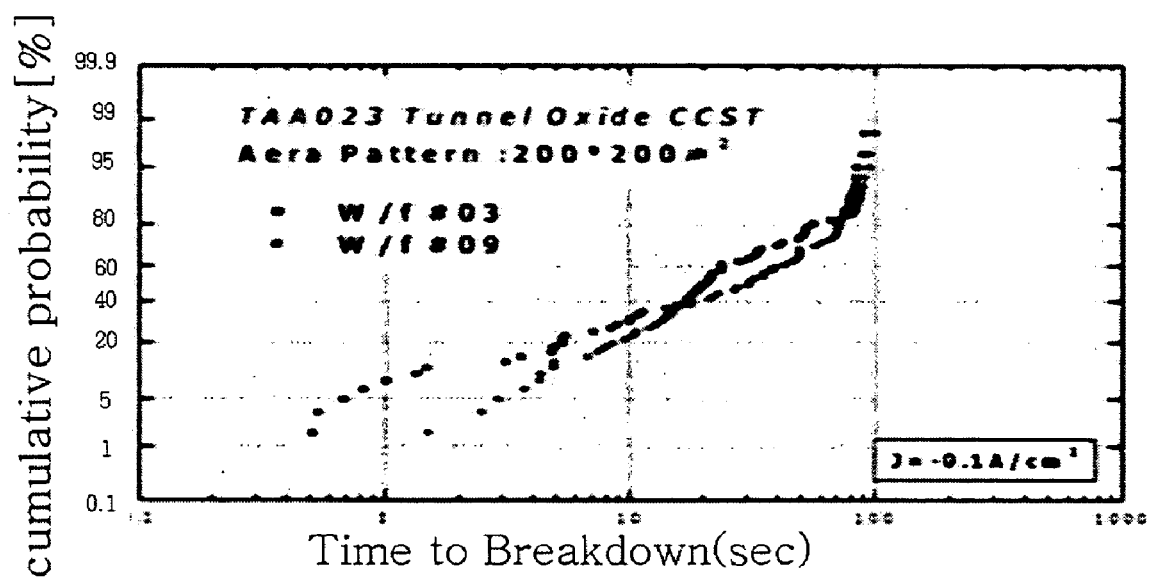
FIG. 2 is a graph showing CCST characteristic results of the tunnel oxide film in the conventional process.

A method for manufacturing a semiconductor device in accordance with a preferred embodiment of the present invention will now be described in detail with reference to the accompanying drawings. Wherever possible, the same reference numerals will be used throughout the drawings and the description to refer to the same or like parts.

FIGS. 3A to 3F are cross-sectional diagrams illustrating sequential steps of the method for manufacturing the semiconductor device in accordance with the present invention.

Figure 3A:
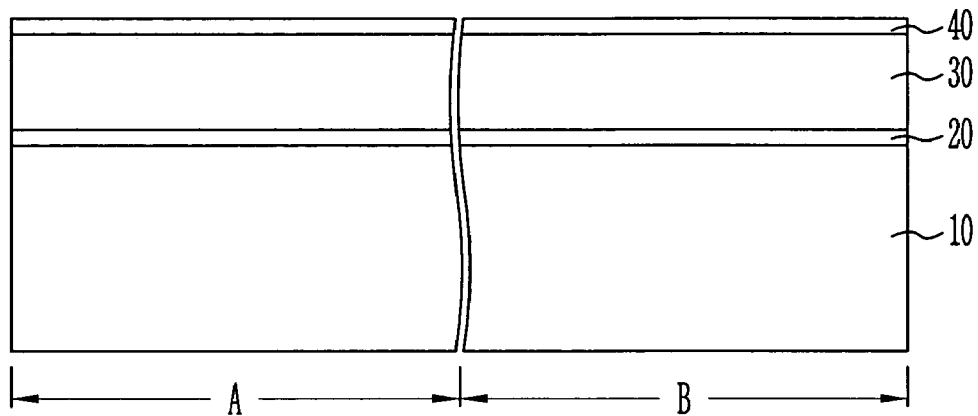
FIGS. 3A to 3F are cross-sectional diagrams illustrating sequential steps of a method for manufacturing a semiconductor device in accordance with the present invention.

As illustrated in FIG. 3A, a pad oxide film 20, a first pad nitride film 30 and a mask oxide film 40 are sequentially formed on a semiconductor substrate 10 on which a first region A for forming a high voltage device (gate oxide film for high voltage device) and a second region B for forming a low voltage or flash device (tunnel oxide film for cell and low voltage device) are defined.

A preprocess cleaning process can be performed to clean the semiconductor substrate 10 before forming the pad oxide film 20, by using dilute HF (DHF) containing $H_2O$ and HF at a ratio of 50:1 and standard cleaning-1 (SC-1) containing $NH_4OH$, $H_2O_2$ and $H_2O$, or buffered oxide etchant (BOE) containing $NH_4F$ and HF at a ratio of 100:1 to 300:1 and SC-1 containing $NH_4OH$, $H_2O_2$ and $H_2O$.

In order to restrict crystal defects on the surface of the semiconductor substrate 10 or process the surface of the semiconductor substrate 10, the pad oxide film 20 having a thickness of 40 to 70 Å is formed at 750 to 800° C. according to a dry or wet oxidation process.

The first pad nitride film 30 is formed on the pad oxide film 20 at a thickness of 100 to 300 Å according to chemical vapor deposition (CVD), low pressure CVD (LPCVD), plasma enhanced CVD (PECVD) or atmospheric pressure CVD (APCVD).

So as to simplify a mask process using the first pad nitride film 30, the mask oxide film 40 is formed at a thickness of 50 to 150 Å according to the CVD, LPCVD, PECVD or APCVD. Preferably, the mask oxide film 40 is formed by using a high temperature oxide (HTO), boron phosphorus silicate glass (BPSG) or tetra ethyle ortho silicate (TEOS) group oxide film. In this embodiment, dichlorosilane ($SiH_2Cl_2$)-HTO (DCS-HTO) oxide film is used as the mask oxide film 40.

Wells and an ion layer (not shown) for controlling a threshold voltage can be formed according to a predetermined ion implant process before forming the pad oxide film 30. That is, N and P type wells can be formed according to a type of the device.

Figure 3B:
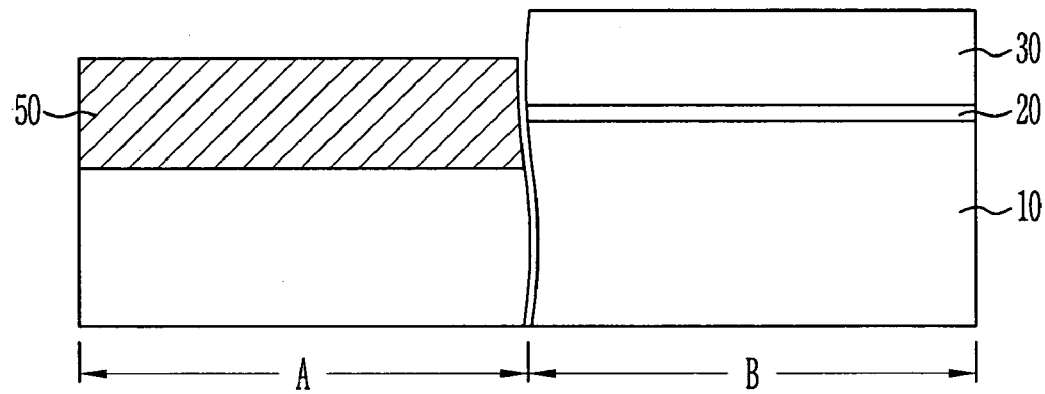

As shown in FIG. 3B, the mask oxide film 40, the first pad nitride film 30 and the pad oxide film 20 in the first region A, and the mask oxide film 40 in the second region B are removed. An oxide film 50 for a high voltage device is formed according to a first oxidation process.

A photoresist film pattern (not shown) for opening the first region A is formed by coating a photoresist film on the mask oxide film 40, and performing a photolithography process using a first region open mask. The mask oxide film 40 in the first region A is etched according to an etching process using the photoresist film pattern as an etch mask. Preferably, the etching process is a wet etching process for removing the oxide film. The photoresist film pattern in the second region B can be etched during the etching process of the mask oxide film 40. The residual photoresist film pattern in the second region B can also be removed according to a special strip process. Accordingly, the first pad nitride film 30 is exposed in the first region A, and the mask oxide film 40 is exposed in the second region B.

The first pad nitride film 30 in the first region A is removed according to an etching process using the residual mask oxide film 40 in the second region B as an etch mask. Preferably, a wet etching process using $H_3PO_4$ solution is performed for 5 to 10 minutes as the etching process. Therefore, the pad oxide film 20 is exposed in the first region A, and the mask oxide film 40 is exposed in the second region B.

The pad oxide film 20 in the first region A is removed according to a predetermined etching process. Here, the mask oxide film 40 in the second region B is preferably removed at the same time. The pad oxide film 20 and the mask oxide film 40 are preferably removed according to a cleaning process before forming the oxide film 50 for the high voltage device. Preferably, the cleaning process is performed by using DHF containing $H_2O$ and HF at a ratio of 50:1 or 100:1 and SC-1 containing $NH_4OH$, $H_2O_2$ and $H_2O$. Preferably, the cleaning process is performed for 65 to 85 seconds by using HF aqueous solution.

The oxide film 50 for the high voltage device is formed on the semiconductor substrate 10 in the first region A exposed according to the first oxidation process. Here, the second region B is not influenced by the first oxidation process due to the first pad nitride film 30. In the first oxidation process, an oxide film having a thickness of 350 to 700 Å is formed by performing a dry or wet oxidation process at 750 to 850° C. In addition, it is efficient to minimize defect density on the interface between the oxide film 50 for the high voltage device and the semiconductor substrate 10, by performing an annealing process at 900 to 910° C. for 20 to 30 minutes by using $N_2$. 50% of the whole thickness of the oxide film 50 for the high voltage device is oxidized on the surface of the semiconductor substrate 10. That is, the oxide film 50 for the high voltage device is oxidized at a ratio of 50:50 on the surface of the semiconductor substrate 10. In this embodiment, most preferably, the oxide film 50 for the high voltage device is formed to have a thickness of 550 to 650 Å considering that it will be partially removed by the succeeding etching or cleaning process.

Figure 3C:
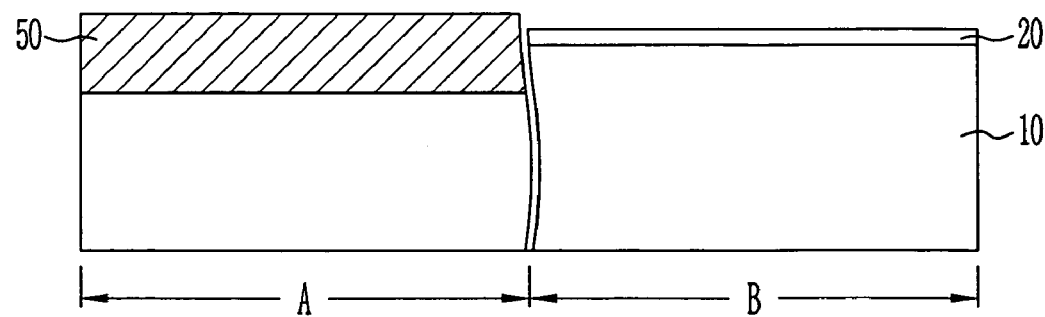
Figure 3D:
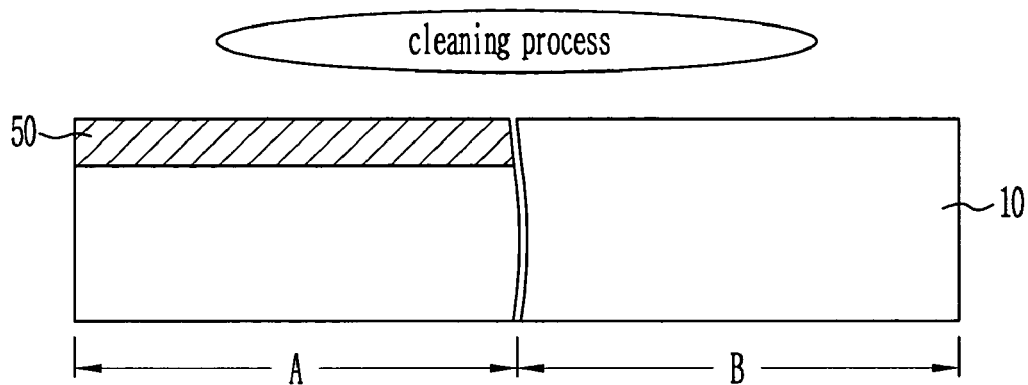

As depicted in FIGS. 3C and 3D, the first pad nitride film 30 in the second region B is removed, and the oxide film 50 for the high voltage device in the first region A is partially removed according to a nitride film strip process. The residual pad oxide film 20 in the second region B is removed, and the oxide film 50 for the high voltage device in the first region A is partially removed according to a cleaning process. Preferably, the oxide film 50 for the high voltage device in the first region A and the semiconductor substrate 10 in the second region B have the same height.

The nitride film strip process removes the first pad nitride film 20 in the second region B, and etches the oxide film 50 for the high voltage device in the first region A so that the residual oxide film 50 for the high voltage device can have a thickness of 300 to 400 Å. Preferably, the nitride film strip process is performed for 500 to 1200 seconds by using the BOE (solution containing HF and $NH_4F$ at a ratio of 100:1 to 300:1), and for 5 to 10 minutes by using $H_3PO_4$. More preferably, the nitride film strip process is performed for 900 to 1100 seconds by using the BOE. When the nitride film strip process is performed shorter than 500 or 900 seconds by using the BOE, the oxide film 50 for the high voltage device in the first region A cannot be removed by a wanted thickness, and when the nitride film strip process is performed longer than 1100 or 1200 seconds, the oxide film 50 for the high voltage device in the first region A is excessively etched.

The nitride film strip process can have various process conditions and time by used chemicals. In this embodiment, most preferably, the nitride film strip process is performed for 1000 seconds by using the BOE at a ratio of 100:1 and for 8 minutes by using $H_3PO_4$, to completely remove the first pad nitride film 30 and maintain the oxide film 50 for the high voltage device by 350 Å. In addition, the pad oxide film 20 in the second region B can be partially etched. That is, the residual pad oxide film 20 in the second region B has a thickness of 20 to 50 Å.

A height of a gate oxide film for a high voltage device which will be formed in the first region A by the succeeding process can be reduced. That is, the first region A can be recessed by increasing a loss of the oxide film 50 in the first region A during the nitride film strip process. Accordingly, a height difference of an element isolation film (field oxide film) formed by the succeeding process can be solved, to improve characteristics of the flash device.

The cleaning process is performed by using HF aqueous solution. Preferably, the cleaning process completely removes the residual pad oxide film 20 in the second region B and minimizes damages of the exposed semiconductor substrate 10. That is, the cleaning process is performed by calculating various process conditions and time for completely removing the residual oxide film 20 having a thickness of 30 to 70 Å in the second region B. The cleaning process can be variously changed by used chemicals and concentration of the chemicals.

Preferably, the cleaning process is performed for 30 to 100 seconds by using HF aqueous solution diluted by $H_2O$ at a ratio of 50:1 to 300:1. As described above, when the cleaning process is performed shorter than 40 seconds, the pad oxide film 20 in the second region B cannot be completely removed, and when the cleaning process is performed longer than 100 seconds, the semiconductor substrate 10 in the second region B is damaged. More preferably, the cleaning process is performed for 40 to 60 seconds by using diluted HF aqueous solution. Most preferably, the cleaning process is performed for 50 seconds by using HF aqueous solution diluted at a ratio of 50:1. In this case, the semiconductor substrate 10 is prevented from being damaged, and the pad oxide film 20 in the second region B is efficiently removed, by targeting 40 Å of the residual oxide film 20 in the second region B. The HF aqueous solution diluted at a ratio of 50:1 can remove 1 Å of oxide film per about 1 second.

The cleaning process completely removes the residual pad oxide film 20 in the second region B, and partially removes the oxide film 50 for the high voltage device in the first region A, thereby reducing a step difference between the oxide film 50 for the high voltage device in the first region A and the semiconductor substrate 10 in the second region B. Preferably, the residual oxide film 50 for the high voltage device in the first region A has a thickness of 250 to 350 Å. Most preferably, the residual oxide film 50 for the high voltage device in the first region A has a thickness of 300 Å.

Figure 4:
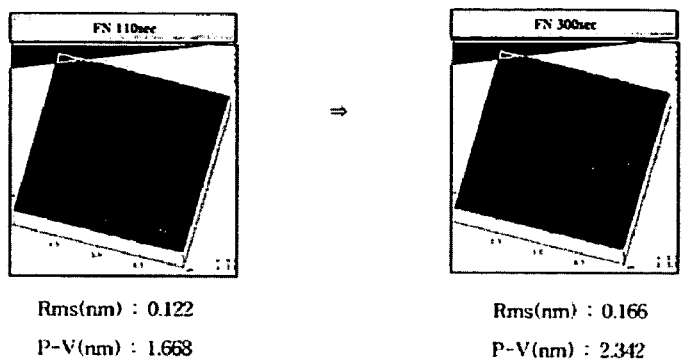
FIG. 4 is photographs showing variations of a semiconductor substrate due to a cleaning process.

FIG. 4 is photographs showing variations of the semiconductor substrate due to the cleaning process.

As shown in FIG. 4, photographs show the surfaces on which the cleaning process using HF aqueous solution has been performed for 110 and 300 seconds, respectively. When the time of the cleaning process using HF aqueous solution increases, the content of H groups of the silicon substrate remarkably increases. That is, H is contained between the silicon junctions, and thus quality of the tunnel oxide film is partially deteriorated during the succeeding process. In accordance with the present invention, it can be solved by optimizing the cleaning process using HF aqueous solution.

Figure 3E:
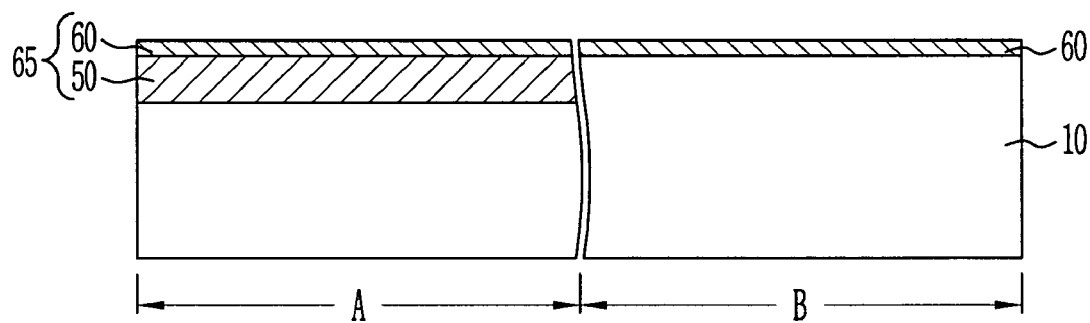

Referring to FIG. 3E, a tunnel oxide film 60 is formed in the first region A and the second region B according to a second oxidation process. Therefore, a gate oxide film 65 for a high voltage device including the oxide film 50 for the high voltage device and the tunnel oxide film 60 is formed in the first region A, and the tunnel oxide film 60 for the low voltage device and cell is formed in the second region B.

In the second oxidation process, the tunnel oxide film 60 having a thickness of 40 to 100 Å is formed by performing a dry or wet oxidation process at 750 to 850° C. Accordingly, the gate oxide film 65 for the high voltage device having a thickness of 300 to 400 Å is formed in the first region A, and the tunnel oxide film 60 having a thickness of 40 to 100 Å is formed in the second region B. Preferably, according to the second oxidation process, the gate oxide film 65 for the high voltage device having a thickness of 320 to 370 Å is formed in the first region A, and the tunnel oxide film 60 having a thickness of 70 to 90 Å is formed in the second region B. A thickness of a gate insulation film is varied according to characteristics of a transistor formed in the succeeding process. After the second oxidation process, an annealing process is performed at 900 to 910° C. for 20 to 30 minutes by using $N_2$, thereby minimizing defect density on the interface between the tunnel oxide film 60 and the semiconductor substrate 10.

Figure 3F:
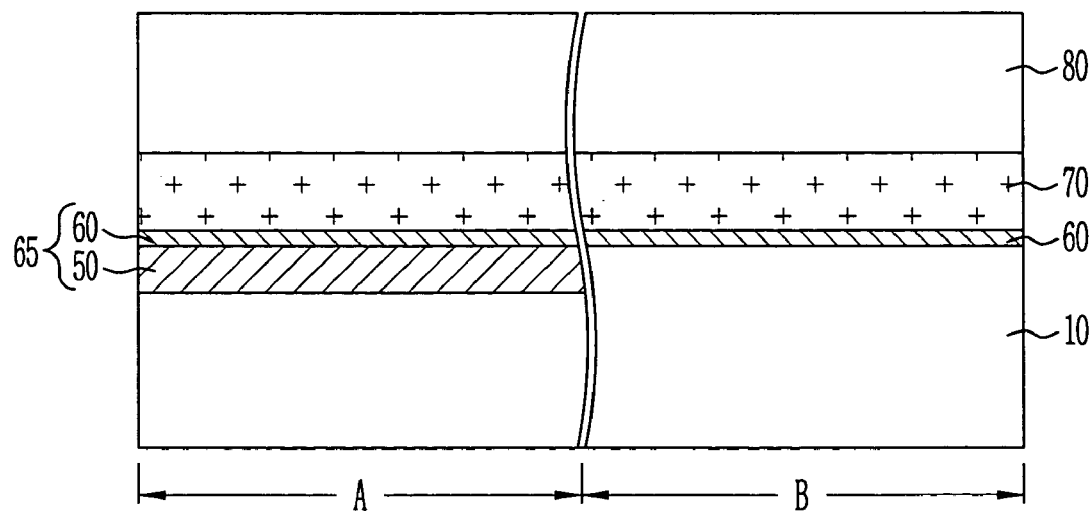

Referring to FIG. 3F, a first polysilicon film 70 and a second pad nitride film 80 are sequentially formed in the first and second regions A and B. A shallow trench isolation (STI) type trench (not shown) is formed by sequentially etching the second pad nitride film 80, the first polysilicon film 70, the gate oxide film 65 for the high voltage device, the tunnel oxide film 60 and the semiconductor substrate 10 according to an ISO mask patterning process.

To prevent contamination of the gate oxide film 65 for the high voltage device and the tunnel oxide film 60 and to be used as a part of a gate electrode of the semiconductor device, the first polysilicon film 70 which is an amorphous silicon film is deposited at a thickness of 250 to 500 Å at 500 to 550° C. under the pressure of 0.1 to 3 torr according to the CVD, LPCVD, PECVD or APCVD by using $SiH_4$ or $Si_2H_6$ and $PH_3$ gas. The second pad nitride film 80 is formed according to a nitride film deposition process of the general method for manufacturing the semiconductor device. In this embodiment, the second pad nitride film 80 having a thickness of 900 to 2000 Å is formed according to the LPCVD. Here, a step difference does not exist between the first region A and the second region B.

An element isolation film (not shown) is formed according to a patterning process, and a second polysilicon film (not shown) is deposited thereon. A gate electrode for a high voltage device is formed in the first region A, and a gate electrode for a low voltage device or a floating gate electrode for a flash memory cell is formed in the second region B according to a planarization or patterning process.

The STI type trench (not shown) is formed in the semiconductor substrate 10 by performing the STI process on the element isolation film (field oxide film). The first polysilicon film 80 is exposed by filling the STI type trench with a high density plasma (HDP) oxide film, and performing the planarization process and the nitride film strip process thereon (removing the second pad nitride film 70). The gate electrode including the first and second polysilicon films is formed by depositing the second polysilicon film over the resulting structure, and performing the patterning or planarization process thereon. However, it must be recognized that various processes for manufacturing a semiconductor device can be applied in different order. Thereafter, the gate electrode for the high voltage device and the source/drain are formed in the first region A, and the gate electrode for the flash device and the source/drain are formed in the second region B.

Figure 5:
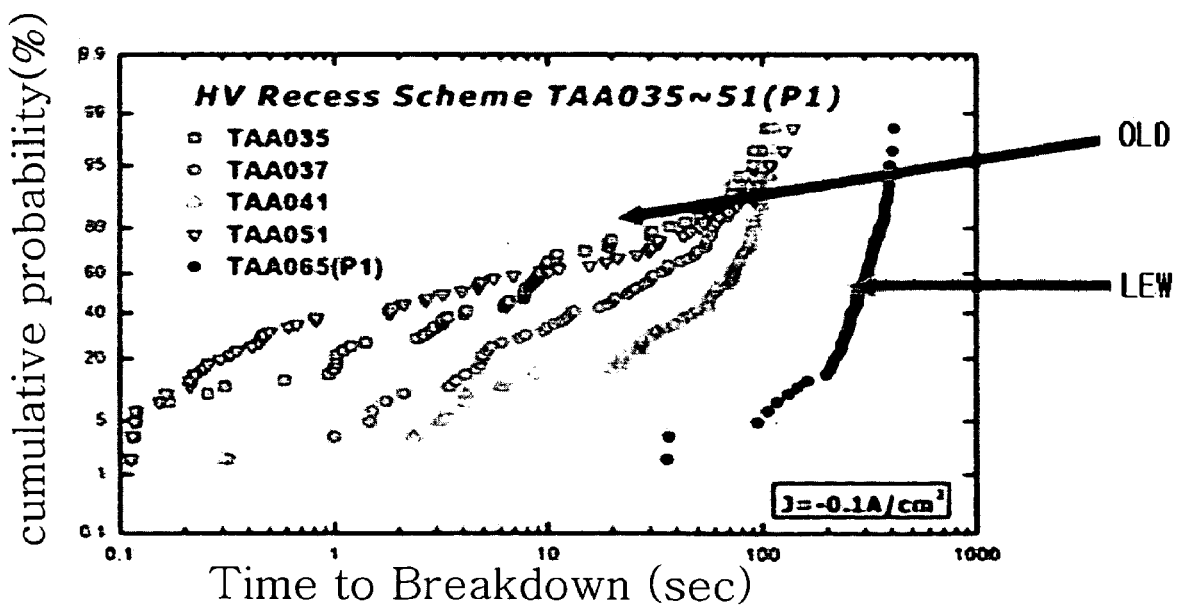
FIG. 5 is a graph showing CCST characteristic results of a tunnel oxide film in the process of the present invention.

FIG. 5 is a graph showing CCST characteristic results of the tunnel oxide film in the process of the present invention.

As shown in FIG. 5, characteristics of the tunnel oxide film are widely distributed in the conventional process, and the time from damage to collapse of the tunnel oxide film is very short (refer to OLD of FIG. 5), but characteristics of the tunnel oxide film are narrowly distributed in the process of the present invention. That is, variations of the collapse time from the top to bottom are constant (refer to NEW of FIG. 5). In addition, the time from damage to collapse of the tunnel oxide film is very long. The collapse time is about 0.1 to 100 seconds in the conventional art, but about 100 to 400 seconds in the present invention.

As discussed earlier, in accordance with the present invention, the method for manufacturing the semiconductor device reduces the step difference between the high voltage device region and the low voltage device and cell region, by forming the oxide film for the high voltage device in the high voltage device region, and reducing the height of the oxide film for the high voltage device by controlling the pad nitride film strip process in the low voltage device and cell region.

Moreover, the method for manufacturing the semiconductor device efficiently removes the residual oxide film and minimizes damages of the semiconductor substrate in the low voltage device and cell region, by controlling the cleaning process before forming the tunnel oxide film for the low voltage device and cell.

Furthermore, the method for manufacturing the semiconductor device improves characteristics of the device, by improving quality of the tunnel oxide film in the low voltage device and cell region, and overcoming the EFH difference by reducing the step difference between the high voltage device region and the gate insulation film in the low voltage device and cell region.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method for forming an element isolation film of a semiconductor device, comprising the steps of:
    sequentially forming a pad oxide film, a pad nitride film and a mask oxide film on a semiconductor substrate on which a first region for forming a high voltage device and a second region for forming a low voltage device or a flash memory cell are defined;
    etching the mask oxide film, the pad nitride film and the pad oxide film in the first region and the mask oxide film in the second region, and forming an oxide film for the high voltage device in the first region, wherein the oxide film for the high voltage device has a first thickness;
    removing the residual pad nitride film in the second region, wherein the oxide film for the high voltage device has a second thickness;
    performing a cleaning process to remove the residual pad oxide film in the second region and to partially remove the oxide film for the high voltage device in the first region, wherein the oxide film for the high voltage device has a third thickness; and,
    forming a tunnel oxide film over the resulting structure, wherein a gate oxide film for a high voltage device including the oxide film for the high voltage device and the tunnel oxide film is formed in the first region, and the tunnel oxide film for the low voltage device and cell is formed in the second region.

2. The method of claim 1, wherein the cleaning process is performed with HF aqueous solution diluted by $H_2O$ at a ratio of 50:1 to 300:1.

3. The method of claim 2, wherein the cleaning process is performed for 30 to 100 seconds.

4. The method of claim 1, wherein the nitride film is removed with buffered oxide etchant and $H_3PO_4$.

5. The method of claim 4, wherein the nitride film strip process is performed for 500 to 1200 seconds with the buffered oxide etchant, and for 5 to 10 minutes with the $H_3PO_4$.

6. The method of claim 1, wherein the first thickness ranges from 350 to 700 Å, the second thickness ranges from 300 to 400 Å, and the third thickness ranges from 250 to 350 Å.

7. The method of claim 1, wherein the step for etching the mask oxide film, the pad nitride film and the pad oxide film in the first region and the mask oxide film in the second region, and forming the oxide film for the high voltage device in the first region comprises the steps of:
    forming a photoresist film pattern for opening the first region on the mask oxide film;
    etching the mask oxide film in the first region and the photoresist film pattern;
    etching the pad nitride film in the first region by using the mask oxide film in the second region as an etch mask;
    etching the pad oxide film in the first region and the mask oxide film in the second region; and
    forming the oxide film for the high voltage device in the first region according to an oxidation process.

* * * * *